(12) United States Patent
Chai

(10) Patent No.: US 10,482,980 B2
(45) Date of Patent: Nov. 19, 2019

(54) SEMICONDUCTOR DEVICE HAVING RING OSCILLATOR AND METHOD OF ARRANGING RING OSCILLATOR

(71) Applicant: SK hynix Inc., Gyeonggi-do (KR)

(72) Inventor: Seung Wan Chai, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/946,299

(22) Filed: Apr. 5, 2018

(65) Prior Publication Data

US 2019/0066806 A1 Feb. 28, 2019

(30) Foreign Application Priority Data

Aug. 31, 2017 (KR) ........................ 10-2017-0110961

(51) Int. Cl.
| | | |
|---|---|---|
| *G11C 16/32* | (2006.01) | |
| *H03K 3/03* | (2006.01) | |
| *H03K 5/134* | (2014.01) | |
| *H03K 3/017* | (2006.01) | |
| *G11C 7/22* | (2006.01) | |
| *H03K 3/356* | (2006.01) | |
| *H03K 5/156* | (2006.01) | |
| *H03K 19/0185* | (2006.01) | |
| *H03K 5/05* | (2006.01) | |
| *G11C 16/04* | (2006.01) | |
| *H03K 5/00* | (2006.01) | |

(52) U.S. Cl.
CPC .............. *G11C 16/32* (2013.01); *G11C 7/222* (2013.01); *H03K 3/017* (2013.01); *H03K 3/0315* (2013.01); *H03K 3/0322* (2013.01); *H03K 3/35613* (2013.01); *H03K 3/356182* (2013.01); *H03K 5/134* (2014.07); *H03K 5/1565* (2013.01); *H03K 19/018528* (2013.01); *H03K 19/018585* (2013.01); *G11C 16/0483* (2013.01); *H03K 5/05* (2013.01); *H03K 2005/00195* (2013.01)

(58) Field of Classification Search
CPC ....... G11C 16/32; G11C 16/0483; G11C 7/22; G11C 29/842; H03K 3/017; H03K 3/0315; H03K 5/134; H03K 5/05; H03K 2005/00195; G06F 13/1689
See application file for complete search history.

(56) References Cited

U.S. PATENT DOCUMENTS

| | | | | |
|---|---|---|---|---|
| 5,565,817 A | * | 10/1996 | Lakshmikumar | .... H03K 3/0315 327/237 |
| 5,638,014 A | * | 6/1997 | Kurita | ................... H03K 3/0231 327/141 |
| 5,841,325 A | * | 11/1998 | Knotts | ................. H03K 3/0231 331/57 |
| 6,501,339 B1 | | 12/2002 | Younis et al. | |
| 2005/0134339 A1 | * | 6/2005 | Younis | ................. H03D 13/003 327/165 |
| 2012/0069884 A1 | * | 3/2012 | Sakurai | ................... H03L 7/091 375/224 |

FOREIGN PATENT DOCUMENTS

KR              101585231        1/2016

\* cited by examiner

*Primary Examiner* — Harry W Byrne
*Assistant Examiner* — Sultana Begum
(74) *Attorney, Agent, or Firm* — IP & T Group LLP

(57) ABSTRACT

A ring oscillator includes first to fourth current-controlled delay circuits configured to allow a delay time to be changed depending on a magnitude of sink current, wherein the first to fourth current-controlled delay circuits are arranged symmetrically to each other about a square.

18 Claims, 13 Drawing Sheets

SEMICONDUCTOR DEVICE HAVING RING OSCILLATOR AND METHOD OF ARRANGING RING OSCILLATOR

CROSS-REFERENCE TO RELATED APPLICATION

The present application claims priority under 35 U.S.C. § 119(a) to Korean patent application number 10-2017-0110961, filed on Aug. 31, 2017, which is herein incorporated by reference in its entirety.

BACKGROUND

1. Field of Invention

An aspect of the present disclosure relates to a semiconductor device having a ring oscillator and a method of arranging a ring oscillator. Particularly, various embodiments of the present disclosure relate to a method of arranging a ring oscillator for matching duty ratios of clock signals generated by the ring oscillator.

2. Description of Related Art

Semiconductors, more specifically, memory devices are classified into volatile memory devices and nonvolatile memory devices. In the volatile memory devices, data is not retained when power is removed from the volatile memory devices. However, in the nonvolatile memory devices, data is retained when power is removed from the nonvolatile memory devices. Examples of the nonvolatile memory devices are a read only memory (ROM), an electrically erasable programmable read-only memory (EEPROM), and the like. The structure and operation of a flash memory device introduced as a flash EEPROM are different from those of typical EEPROMs.

Various semiconductors such as a flash memory device may perform an electric erase operation in units of blocks and perform a program operation in units of bits.

A semiconductor device may receive data for a program operation and transmit read data. Also, a semiconductor device may include a ring oscillator therein so as to receive and transmit data at high speed. Thus, there is a need for accurately matching the duty ratios of a ring oscillator so as to perform a high-speed data input/output operation.

SUMMARY

Embodiments provide a semiconductor device including a ring oscillator of which duty ratios are matched.

According to an aspect of the present disclosure, there is provided a ring oscillator including first to fourth current-controlled delay circuits configured to allow a delay time to be changed depending on a magnitude of sink current, wherein the first to fourth current-controlled delay circuits are arranged symmetrically to each other about a square.

According to an aspect of the present disclosure, there is provided a semiconductor device including: a ring oscillator configured to generate a clock signal, wherein the ring oscillator includes: first to fourth current-controlled delay circuits configured to allow a delay time to be changed depending on the magnitude of sink current; a current control circuit configured to determine a magnitude of the sink current; and first to fourth differential input-single output converters respectively coupled to the first to fourth current-controlled delay circuits, wherein the first to fourth differential input-single output converters are arranged adjacent or at four sides of a square, respectively.

According to an aspect of the present disclosure, there is provided a memory device including: a ring oscillator configured to generate a first clock signal; a frequency divider configured to output a second clock signal in response to the first clock signal; and an input/output circuit configured to perform a data input/output operation in synchronization with the second clock signal, wherein the ring oscillator includes: first to fourth current-controlled delay circuits; and first to fourth differential input-single output converters respectively coupled to the first to fourth current-controlled delay circuits, wherein the first to fourth current-controlled delay circuits are arranged adjacent or at four sides of a virtual square, respectively, wherein the first to fourth differential input-single output converters are arranged adjacent or at four vertexes of the square, respectively.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
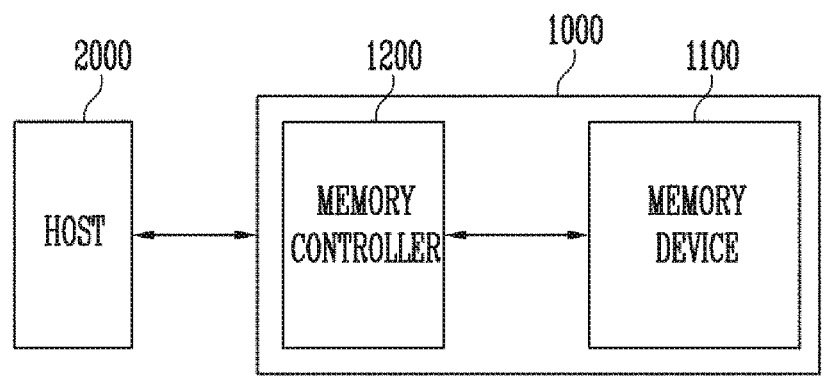
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a memory device 1100 that stores data and a memory controller 1200 that controls the memory device 1100 under the control of a host 2000.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 2000 and the memory system 1000 are not limited to the above-described examples, and may be one of other interface protocols such as a universal serial bus (USB), a multi-media card (MMC), an enhanced small disk interface (ESDI), and integrated drive electronics (IDE).

The memory controller 1200 may control overall operations of the memory system 1000, and control data exchange between the host 2000 and the memory device 1100. For example, the memory controller 1200 may program or read data by controlling the memory device 1100 in response to a request of the host 2000. Also, the memory controller 1200 may store information of main memory blocks and sub-memory blocks, which are included in the memory device 1100, and select the memory device 1100 to perform a program operation on a main memory block or a sub-memory block according to the amount of data loaded for the program operation. In some embodiments, the memory device 1100 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory. However, the memory device 1100 is not limited to the above-mentioned examples and may include any suitable type of semiconductor device such as a data processor, a micro-control unit, an electronic sensor, and a telecommunication chip.

The memory device 1100 may perform a program, read, or erase operation under the control of the memory controller 1200.

Figure 2:
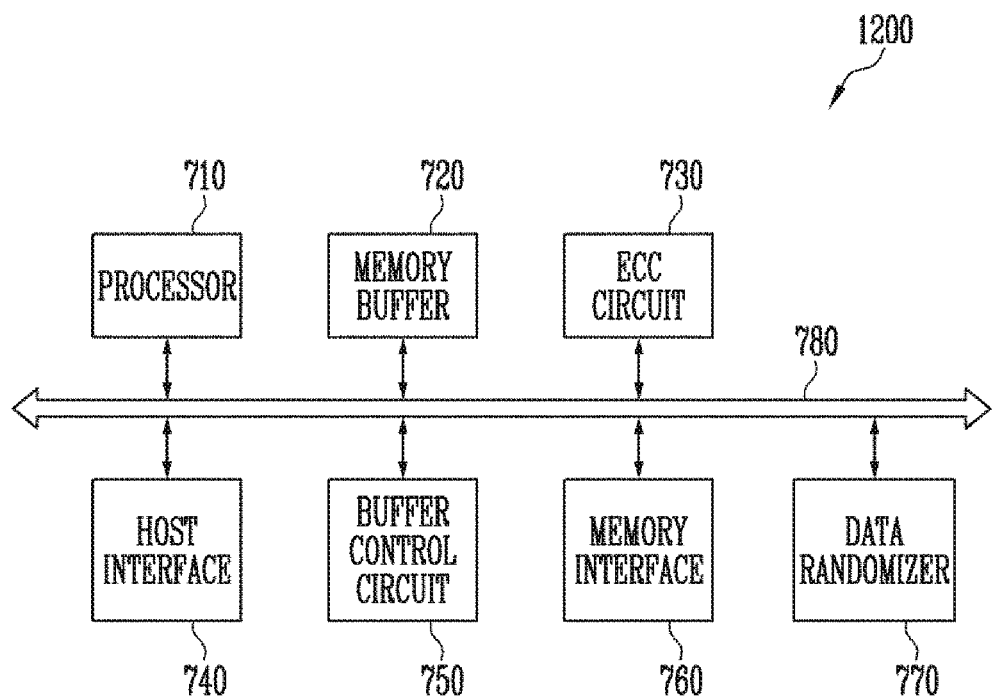
FIG. 2 is a diagram illustrating a memory controller of FIG. 1.

FIG. 2 is a diagram illustrating the memory controller of FIG. 1.

Referring to FIG. 2, the memory controller 1200 may include a processor 710, a memory buffer 720, an error correction code (ECC) circuit 730, a host interface 740, a buffer control circuit 750, a memory interface 760, a data randomizer 770, and a bus 780.

The bus 780 may provide channels between components of the memory controller 1200.

The processor 710 may control overall operations of the memory controller 1200, and perform a logical operation. The processor 710 may communicate with the external host 2000 through the host interface 740, and communicate with the memory device 1100 through the memory interface 760. Also, the processor 710 may communicate with the memory buffer 720 through the buffer control circuit 750. The processor 710 may control an operation of the memory system 1000 by using the memory buffer 720 as a working memory, a cache memory, or a buffer memory.

The processor 710 may queue a plurality of commands input from the host 2000. Such an operation is referred to as a multi-queue. In this case, a queued command may be referred to as a tag. The processor 710 may sequentially transfer a plurality of queued tags to the memory device 1100. Also, the processor 710 may transfer a plurality of queued tags, of which the sequence is changed, to the memory device 1100. In other words, the processor 710 may use various methods including order of priority, cross reference, and the like.

The memory buffer 720 may be used as the working memory, the cache memory, or the buffer memory of the processor 710. The memory buffer 720 may store codes and commands, which are executed by the processor 710. The memory buffer 720 may include a static RAM (SRAM) or a dynamic RAM (DRAM).

The ECC circuit 730 may perform an ECC operation. The ECC circuit 730 may perform ECC encoding on data to be written in the memory device 1100 through the memory interface 760. The ECC encoded data may be transferred to the memory device 1100 through the memory interface 760. The ECC circuit 730 may perform ECC decoding on data received from the memory device 1100 through the memory interface 760. As an example, the ECC circuit 730 may be included as a component of the memory interface 760 in the memory interface 760.

The host interface 740 may communicate with the external host 2000 under the control of the processor 710. The host interface 740 may communicate with the host 2000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 750 may control the memory buffer 720 under the control of the processor 710.

The memory interface 760 may communicate with the memory device 1100 under the control of the processor 710. The memory device 760 may communicate a command, an address, and data with the memory device 1100 through a channel.

In an embodiment, the memory controller 1200 may not include the memory buffer 720 and the buffer control circuit 750.

In an embodiment, the processor 710 may control an operation of the memory controller 1200, using codes. The processor 710 may load codes from a nonvolatile memory device (e.g., a read only memory (ROM)) provided inside the memory controller 1200. As another example, the processor 710 may load codes from the memory device 1100 through the memory interface 760.

The data randomizer 770 may randomize data or de-randomize the randomized data. The data randomizer 770 may perform a data randomizing operation on data to be written in the memory device 1100 through the memory interface 760. The randomized data may be transferred to the memory device 1100 through the memory interface 760. The data randomizer 770 may perform a data de-randomizing operation on data received from the memory device 1100 through the memory interface 760. As an example, the data randomizer 770 may be included as a component of the memory interface 760 in the memory interface 760.

In an embodiment, the bus 780 of the memory controller 1200 may be divided into a control bus and a data bus. The data bus may transmit data in the memory controller 1200, and the control bus may transmit control information such as a command and an address in the memory controller 1200. The data bus and the control bus are separated from each other, and may not interfere or influence with each other. The data bus may be coupled to the host interface 740, the buffer control circuit 750, the ECC circuit 730, and the memory interface 760. The control bus may be coupled to the host interface 740, the processor 710, the buffer control circuit 750, the memory buffer 720, and the r memory interface 760.

Figure 3:
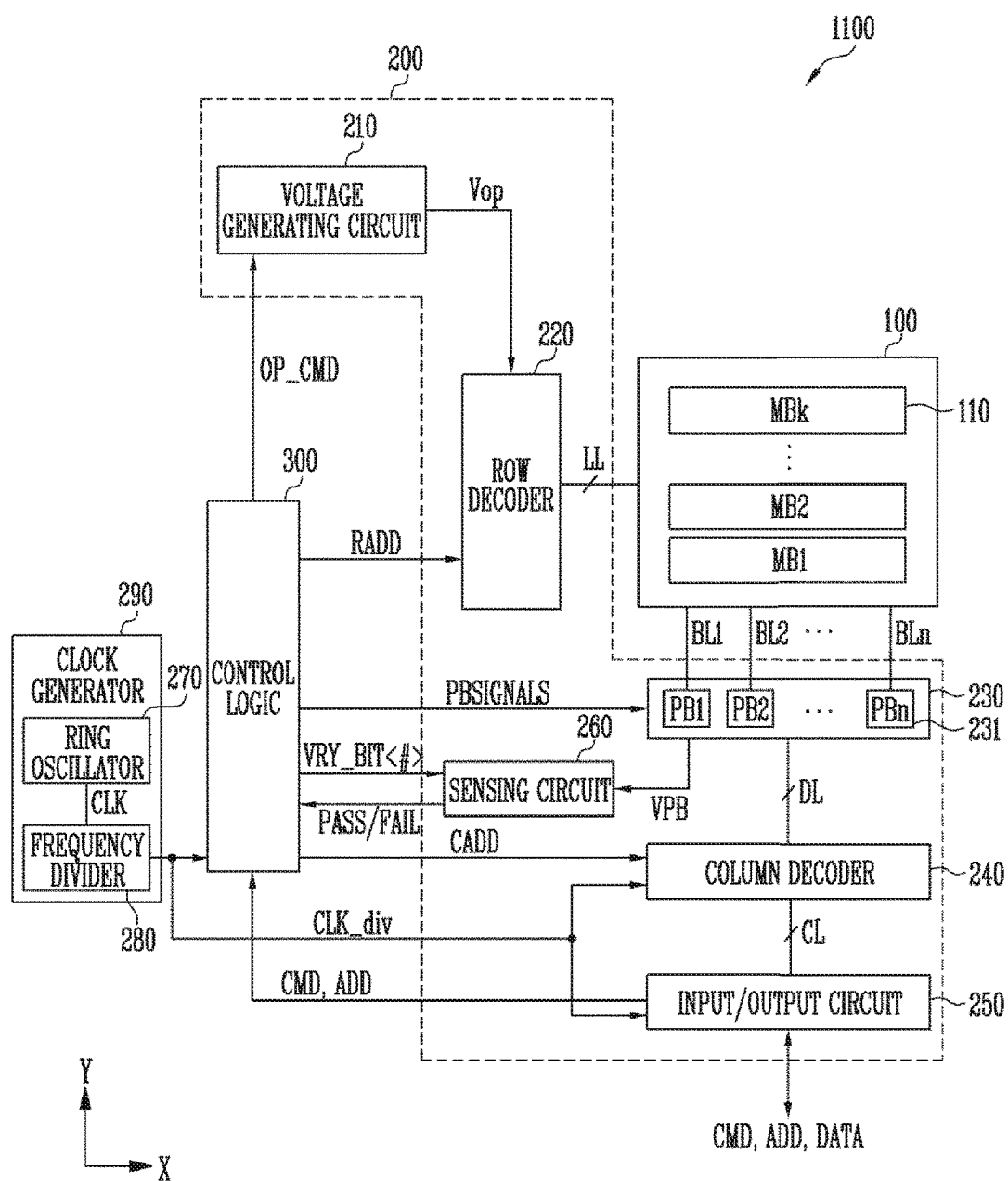
FIG. 3 is a diagram illustrating a memory device of FIG. 1.

FIG. 3 is a diagram illustrating the memory device 1100 of FIG. 1.

Referring to FIG. 3, the memory device 1110 may include a memory cell array 100 that stores data. The memory device 1110 may include peripheral circuits 200 that may perform a program operation for storing data in the memory cell array 100, a read operation for outputting the stored data, and an erase operation for erasing the stored data. The memory device 1110 may include a control logic 300 that controls the peripheral circuits 200 under the control of the memory controller (1200 of FIG. 1).

The memory cell array 100 may include a plurality of memory blocks MB1 to MBk 110 (where k is a positive integer). Local lines LL and bit lines BL1 to BLn (where n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk 110 may be implemented in a two-dimensional (2D) or a three-dimensional (3D) structure. For example, the memory cells in the memory blocks 110 having the 2D structure may be arranged horizontally on a substrate. For example, memory cells in the memory blocks 110 having a 3D structure may be stacked vertically on the substrate.

The peripheral circuits 200 may perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and address ADD, which are received from the memory controller (1200 of FIG. 1), to the control logic 300, or exchange data DATA with the column decoder 240.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

The memory device 1100 may further include a clock generator 290. In addition, the clock generator 290 may include a ring oscillator 270 and a frequency divider 280.

The ring oscillator 270 may generate a clock signal CLK. In addition, the frequency divider 280 may generate a division clock signal CLK_div, based on the clock signal CLK generated by the ring oscillator 270. The division clock signal CLK_div may have a frequency that is two or four times higher than that of the clock signal CLK. In other words, the frequency divider 280 may increase the frequency of the clock signal CLK generated by the ring oscillator 270. The division clock signal CLK_div may be input to the control logic 300, the column decoder 240 and the input/output circuit 250. The column decoder 240 and the input/output circuit 250 may perform a data input/output operation in synchronization with the division clock signal CLK_div generated by the clock generator 290. As another example, the color generator 290 may not include the frequency divider 280. In other words, the clock generator 290 does not change the frequency of the clock signal CLK generated by the ring oscillator 270 but may transfer the clock signal CLK as it is to the control logic 300, the column decoder 240, and the input/output circuit 250. The clock generator 290 may be implemented and used in other semiconductor devices in addition to the memory device 1100.

Figure 4:
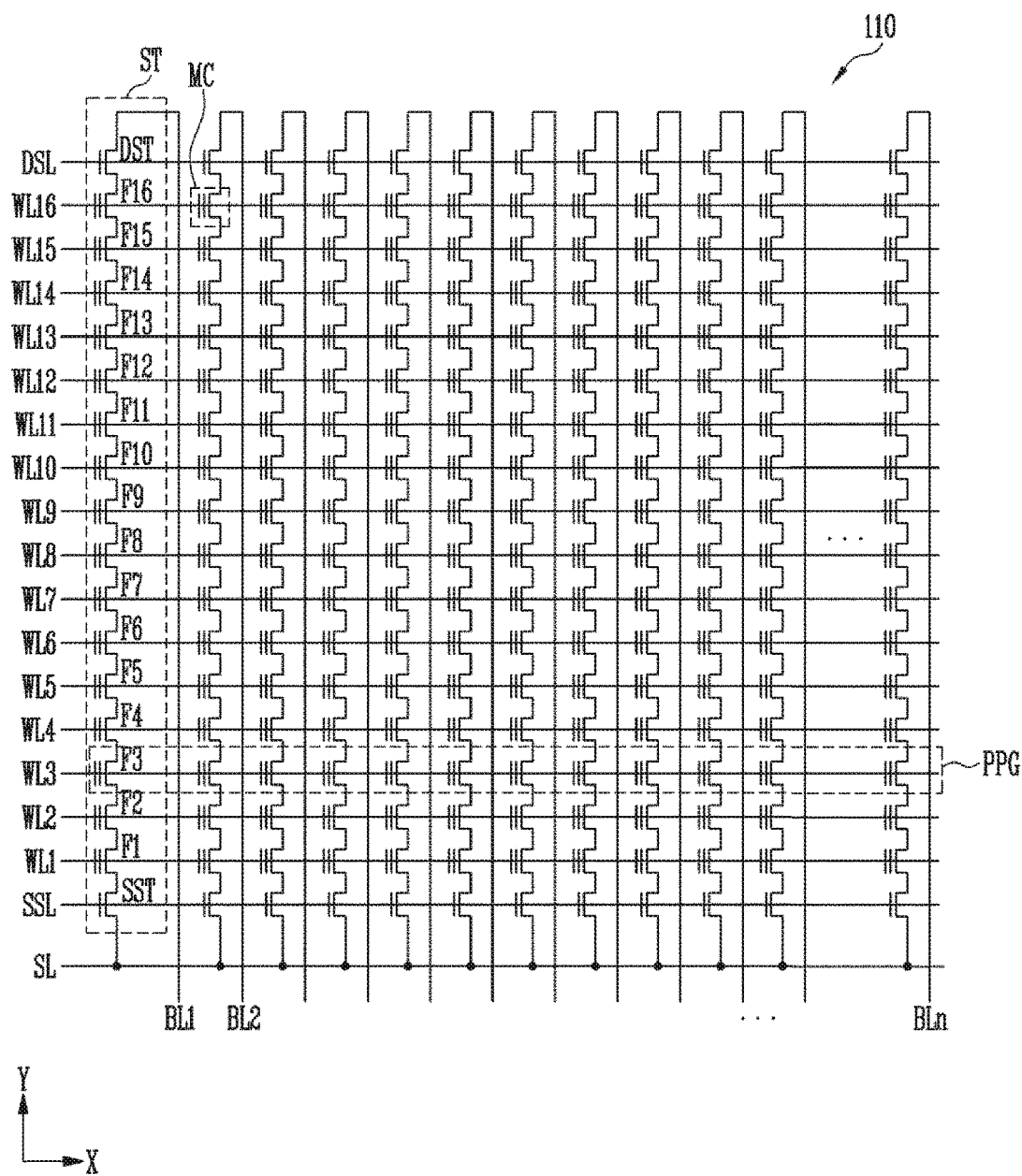
FIG. 4 is a diagram illustrating a memory block of FIG. 3.

FIG. 4 is a diagram illustrating the memory block of FIG. 3.

Referring to FIG. 4, a plurality of word lines arranged in parallel to one another between a first select line and a second select line may be coupled to the first memory block 110. Here, the first select line may be a source select line SSL, and the second select line may be a drain select line DSL. More specifically, the first memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. Since the strings ST may be configured identical to one another, only a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and memory cells of which the number is larger than that of the memory cells F1 to F16 shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, physical pages PPG of which the number corresponds to that of the word lines WL1 to WL16 may be included in the first memory block 110.

One memory cell MC may store one bit of data. This is generally called as a single level cell (SLC). In this case, one physical page PPG may store one logical page (LPG) data. The one LPG data may include data bits of which the number corresponds to that of cells included in one physical page PPG. In addition, one memory cell MC may store two or more bits of data. This is generally called as a multi-level cell. In this case, one physical page PPG may store two or more LPG data.

Figure 5:
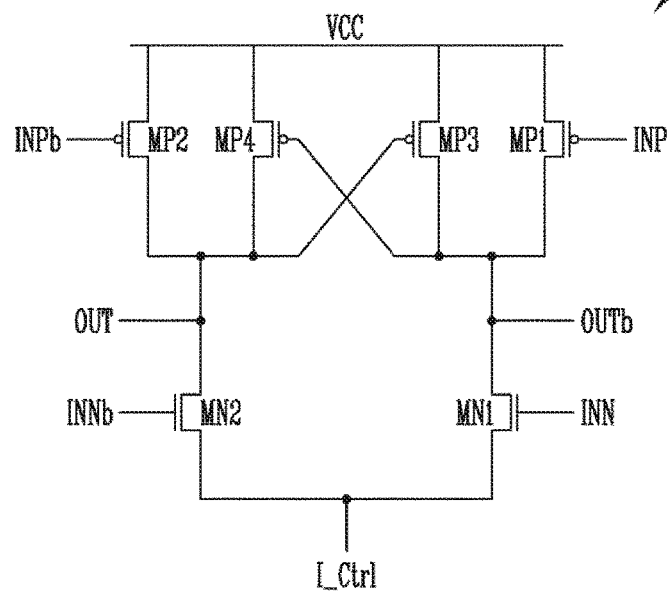
FIG. 5 is a diagram illustrating a current-controlled delay circuit according to an embodiment of the present disclosure.

FIG. 5 is a diagram illustrating a current-controlled delay circuit 271 according to an embodiment of the present disclosure.

Referring to FIG. 5, the current-controlled delay circuit 271 may allow the magnitude of delay time to be controlled according to the magnitude of sink current. In other words, the magnitude of delay time caused by the current-controlled delay circuit 271 may be controlled according to the magnitude of current sunk through a current control node I_Ctrl. That is, as the magnitude of current sunk through the current control node I_Ctrl increases, the magnitude of delay time caused by the current-controlled delay circuit 271 decreases, for instance. As the magnitude of current sunk through the current control node I_Ctrl may decrease, the magnitude of delay time caused by the current-controlled delay circuit 271 may increase, for instance. In other words, the current-controlled delay circuit 271 may be configured such that the magnitude of delay time is changed depending on the magnitude of sink current.

The current-controlled delay circuit 271 may include two NMOS transistors, i.e., a first NMOS transistor MN1 and a second NMOS transistor MN2, which are controlled by two input signals having different phases, i.e., an N-input INN and an N-input bar INNb. The N-input INN input to a gate node of the first NMOS transistor MN1 and the N-input bar INNb input to a gate node of the second NMOS transistor MN2 may have a phase difference of 180 degrees, for instance. As an example, when the N-input has a phase of 90 degrees, the N-input bar INN may have a phase of 270 degrees. Source nodes of the first NMOS transistor MN1 and the second NMOS transistor MN2 may be commonly coupled to the current control node I_Ctrl.

The current-controlled delay circuit 271 may include two PMOS transistors, i.e., a first PMOS transistor MP1 and a second PMOS transistor MP2, which are controlled by two input signals having different phases, i.e., a P-input INP and a P-input bar INPb. The P-input INP input to a gate node of the first PMOS transistor MP1 and the P-input bar INPb input to a gate node of the second PMOS transistor MP2 may have a phase difference of 180 degrees, for instance. As an example, when the P-input INP has a phase of 135 degrees, the P-input bar INPb has a phase of 315 degrees. Source nodes of the first PMOS transistor MP1 and the second PMOS transistor MP2 may be commonly coupled to a power voltage VCC.

The P-input INP and the N-input INN may have a phase difference of 45 degrees, for instance. In addition, the P-input bar INPb and the N-input bar INNb may have a phase difference of 45 degrees, for instance. As an example, when the N-input INN has a phase of 90 degrees, the P-input INP may have a phase of 135 degrees. In addition, when the P-input bar INPb has a phase of 315 degrees, the N-input bar INNb may have a phase of 270 degrees.

The current-controlled delay circuit 271 may include a third PMOS transistor MP3 coupled in parallel to the first PMOS transistor MP1 and a fourth PMOS transistor MP4 coupled in parallel to the second PMOS transistor MP2. In addition, the third PMOS transistor MP3 and the fourth PMOS transistor MP4 may be cross-coupled to each other. That is, a drain node of the third PMOS transistor MP3 may be coupled to a gate node of the fourth PMOS transistor MP4, and a drain node of the fourth PMOS transistor MP4 may be coupled to a gate node of the third PMOS transistor MP3.

A drain node of the first NMOS transistor MN1 and drain nodes of the first PMOS transistor MP1 and the third PMOS transistor MP3 may be commonly coupled to an output bar node OUTb. In addition, a drain node of the second NMOS transistor MN2 and drain nodes of the second PMOS transistor MP2 and the fourth PMOS transistor MP4 may be commonly coupled to an output node OUT. The output node OUT and the output bar node OUTb may have a phase difference of 180 degrees. In addition, the N-input INN input to the gate node of the first NMOS transistor MN1 and the output bar node OUTb may have a phase difference of 90 degrees, and the N-input bar INNb input to the gate node of the second NMOS transistor MN2 and the output node OUT may have a phase difference of 90 degrees. As an example, when the N-input INN has a phase of 90 degrees, the output bar node OUTb may have a phase of 0. When the N-input bar has a phase of 270 degrees, the output node OUT may have a phase of 180 degrees.

Figure 6:
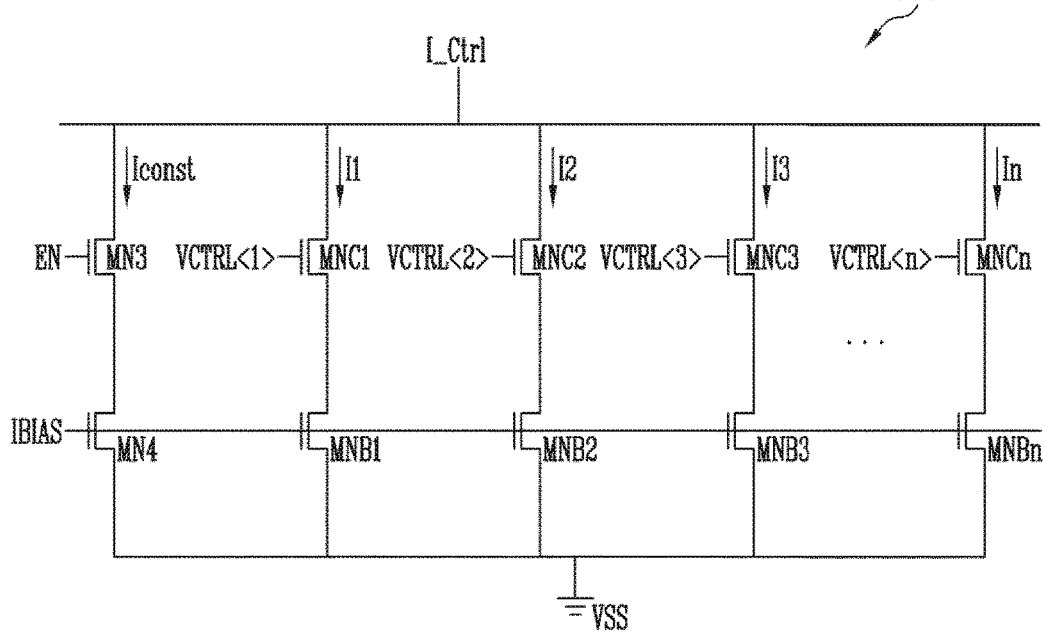
FIG. 6 is a diagram illustrating a current control circuit according to an embodiment of the present disclosure.

FIG. 6 is a diagram illustrating a current control circuit according to an embodiment of the present disclosure.

Referring to FIG. 6, the current control circuit 272 is coupled to the current-controlled delay circuit 271 through the current control node I_Ctrl, and may control the magnitude of current flowing from the current control node I_Ctrl to a ground voltage VSS. In other words, the current control circuit 272 may control the magnitude of sink current of the current controlled circuit 271. That is, the current control circuit 272 may control the delay time of the current-controlled delay circuit 271 by controlling the magnitude of sink current of the current-controlled delay circuit 271.

The current control circuit 272 may include a plurality of transistors MN4 and MNB1 to MNBn controlled by a current bias signal IBIAS. The current bias signal IBIAS may control a certain current to flow through the plurality of transistors MN4 and MNB1 to MNBn.

The current control circuit 272 may be activated by an enable signal EN, a constant current Iconst may flow from the current control node I_Ctrl to the ground voltage VSS through a third NMOS transistor MN3 controlled by the enable signal EN and a fourth NMOS transistor MN4 controlled by the current bias signal IBIAS when the current control circuit 272 is activated. At this time, the enable signal EN may be logic 'High.'

First to n-th bias transistors MNB1 to MNBn may have magnitudes different from one another. In other words, the first to n-th bias transistors MNB1 to MNBn may have widths different from one another. As an example, the second bias transistor MNB2 may have a magnitude that is two times larger than that of the first bias transistor MNB1, and the third bias transistor MNB3 may have a magnitude that is two times larger than that of the second bias transistor MNB2. That is, the first to nth bias transistors MNB1 to MNBn may have magnitudes that sequentially increase by two times. As another example, the second bias transistor MNB2 may have a configuration in which two first bias transistors MNB1 are coupled in parallel, and the third transistor MNB3 may have a configuration in which four first bias transistors MNB1 are coupled in parallel. That is, the second bias transistors MNB1 may have a configuration in which drain nodes, gate nodes, and source nodes of two first bias transistors MNB1 are coupled to each other. That is, the second to n-th bias transistors MNB2 to MNBn may have a configuration in which first bias transistors MNB1 of which the numbers sequentially increase by two times are coupled to in parallel. By such a configuration, currents I1 to In flowing through the first to nth bias transistors MNB1 to MNBn may be different from one another. In other words, the currents I1 to In flowing through the first to n-th bias transistors MNB1 to MNBn may sequentially increase by two times. That is, I2 may be two times of I1, and I3 may be I2. By such a configuration, the current control circuit 272 can accurately control the magnitude of current flowing from the current control node I_Ctrl to the ground voltage VSS. In other words, the current control circuit 272 can effectively the delay time of the current-controlled delay circuit 271 by accurately controlling the magnitude of sink current of the current-controlled delay circuit 271 by the above-described configuration.

The first to n-th bias transistors MNB1 to MNBn may be coupled in series to first to n-th control transistors MNC1 to MNCn, respectively. The first to n-th control transistors MNC1 to MNCn may be controlled to be turned on or turned off by first to n-th control signals VCTRL.<n:1>, respectively.

Figure 7:
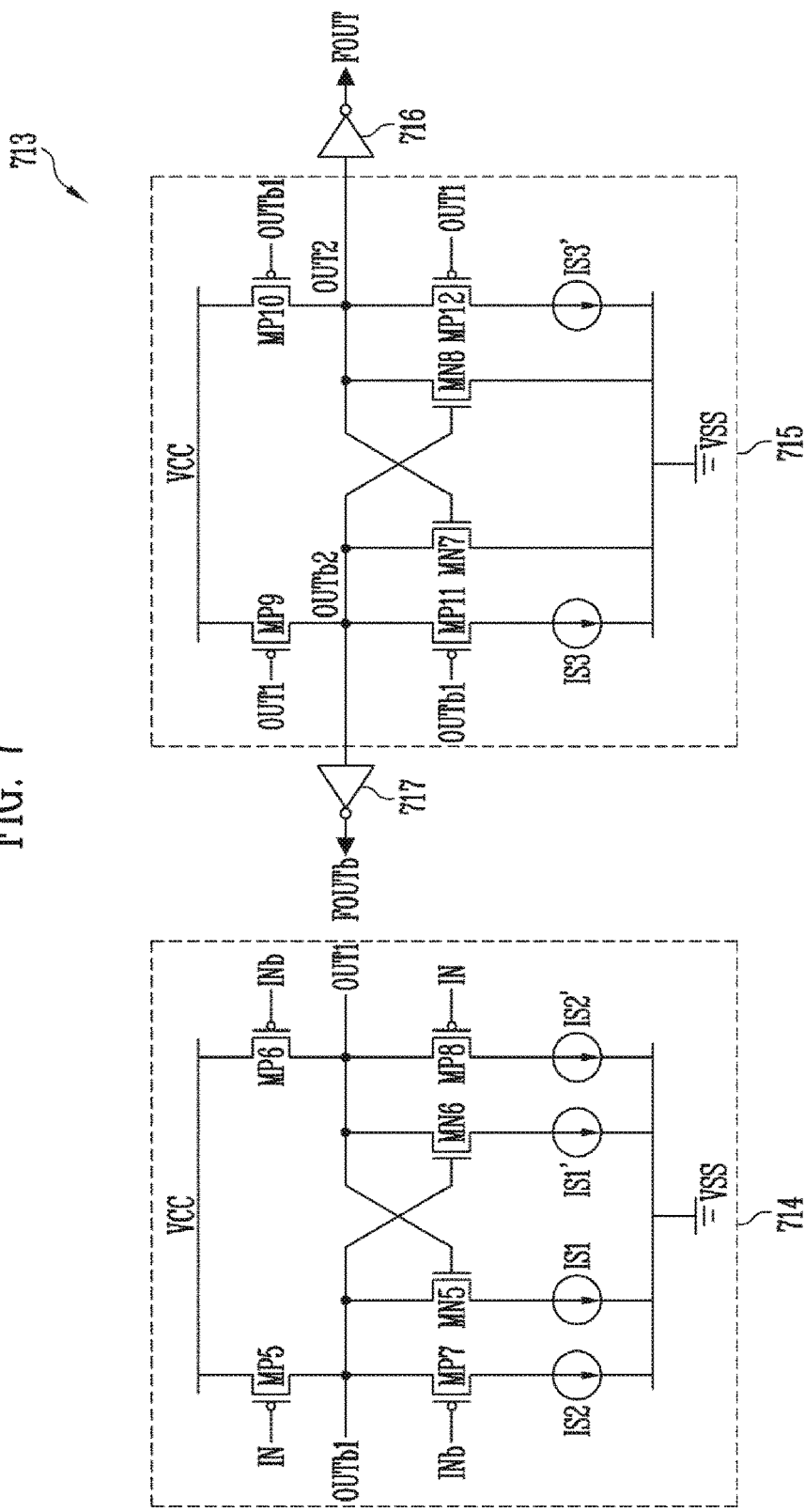
FIG. 7 is a diagram illustrating a differential input-single output converter according to an embodiment of the present disclosure.

FIG. 7 is a diagram illustrating a differential input-single output converter 713 according to an embodiment of the present disclosure.

Referring to FIG. 7, the differential input-single output converter 713 may include a pre-amp 714, an output-amp 715, a first inverter 716, and a second inverter 717.

The pre-amp 714 may include a fifth PMOS transistor MP5 and an eighth PMOS transistor MP8, which are controlled by an input signal IN. Also, the pre-amp 714 may include a sixth PMOS transistor MP6 and a seventh PMOS transistor MP7, which are controlled by an input bar signal INb. At this time, the source nodes of the fifth PMOS transistor MPS and the sixth PMOS transistor MP6 may be commonly coupled to the power voltage VCC. The input signal IN and the input bar signal INb have a phase difference of 180 degrees, for instance. As an example, when the input signal IN has a phase of 0 degree, and the input bar signal INb may have a phase of 180 degrees.

The seventh PMOS transistor MP7 and the eighth PMOS transistor MP8 may be coupled to two second current sources IS2 and IS2', respectively. In addition, a source node of the seventh PMOS transistor MP7 may be coupled to a first output bar node OUTb1, and a source node of the eighth PMOS transistor MP8 may be coupled to a first output node OUT1. A second current source IS2 may be coupled between the seventh PMOS transistor MP7 and the ground voltage VSS, and another second current source IS2' may be coupled between the eighth PMOS transistor MP8 and the ground voltage VSS. Currents having the same magnitude may flow through the two second current sources IS2 and IS2'.

The pre-amp 714 may include a fifth NMOS transistor MN5 coupled between the first output bar node OUTb1 and the ground voltage VSS and a sixth NMOS transistor MN6 coupled between the first output node OUT1 and the ground voltage VSS. The fifth NMOS transistor MN5 and the sixth NMOS transistor MN6 may be cross-coupled to each other. That is, a drain node of the fifth NMOS transistor MN5 may be coupled to a gate node of the sixth NMOS transistor MN6, and a drain node of the sixth NMOS transistor MN6 may be coupled to a gate node of the fifth NMOS transistor MN5. In addition, the drain node of the fifth NMOS transistor MN5 and the gate node of the sixth NMOS transistor MN6 may be commonly coupled to the first output bar node OUTb1, and the drain node of the sixth NMOS transistor MN6 and the gate node of the fifth NMOS transistor MN5 may be commonly coupled to the first output node OUT1. A first current source IS1 may be coupled between the fifth NMOS transistor MN5 and the ground voltage VSS, and another first current source IS1' may be coupled between the sixth NMOS transistor MN6 and the ground voltage VSS. Currents having the same magnitude may flow through the two first current sources IS1 and IS1'.

The output-amp 715 may include ninth to twelfth PMOS transistors MP9, MP10, MP11, and MP12 using the first output node OUT1 and the first output bar node OUTb1 of the pre-amp 714 as input nodes. Gate nodes of the ninth PMOS transistor MP9 and the twelfth PMOS transistor MP12 may be commonly coupled to the first output node OUT1 to of the pre-amp 714. In addition, gate nodes of the tenth PMOS transistor MP10 and the eleventh PMOS transistor MP11 may be commonly coupled to the first output bar node OUTb1 of the pre-amp 714. The tenth PMOS transistor MP10 may be coupled between the power voltage VCC and a second output node OUT2, and the ninth PMOS transistor MP9 may be coupled between the power voltage VCC and a second output bar node OUTb2.

The eleventh PMOS transistor may be coupled between the ground voltage VSS and a second output bar node OUTb2, and the twelfth PMOS transistor MP12 may be coupled between the ground voltage VSS and the second output node OUT2. A third current source IS3 may be coupled between the eleventh PMOS transistor MP11 and the ground voltage VSS, and another third current source IS3' may be coupled between the twelfth PMOS transistor MP12 and the ground voltage VSS. Currents having the same magnitude may flow through the two third current sources IS3 and IS3'.

A seventh NMOS transistor MN7 may be coupled between the second output bar node OUTb2 and the ground voltage VSS, and an eighth NMOS transistor MN8 may be coupled between the second output node OUT2 and the ground voltage VSS. The seventh NMOS transistor MN7 and the eighth NMOS transistor MN8 may be cross-coupled to each other. That is, a drain node of the seventh NMOS transistor MN7 may be coupled to a gate node of the eighth NMOS transistor MN8, and a drain node of the eighth NMOS transistor MN8 may be coupled to a gate node of the seventh NMOS transistor MN7. The second output node OUT2 may be coupled as an input node of the first inverter 716, and the first inverter 716 may be coupled to a final output node FOUT. In addition, the second output bar node OUTb2 may be coupled as an input node of the second inverter 717, and the second inverter 717 may be coupled to a final output bar node FOUTb.

The input signal IN and the first output node OUT1 may have phases equal to each other, and the input node IN and the first output bar node OUTb1 may have phases opposite to each other. That is, the input node IN and the first output bar node OUTb1 may have a phase difference of 180 degrees, for instance. In addition, the first output node OUT1 and the second output node OUT2 may have phases equal to each other. Consequently, the input signal IN and the final output node FOUT may phases opposite to each other. That is, the input signal IN and the final output node FOUT may have a phase difference of 180 degrees, for instance.

Figure 8:
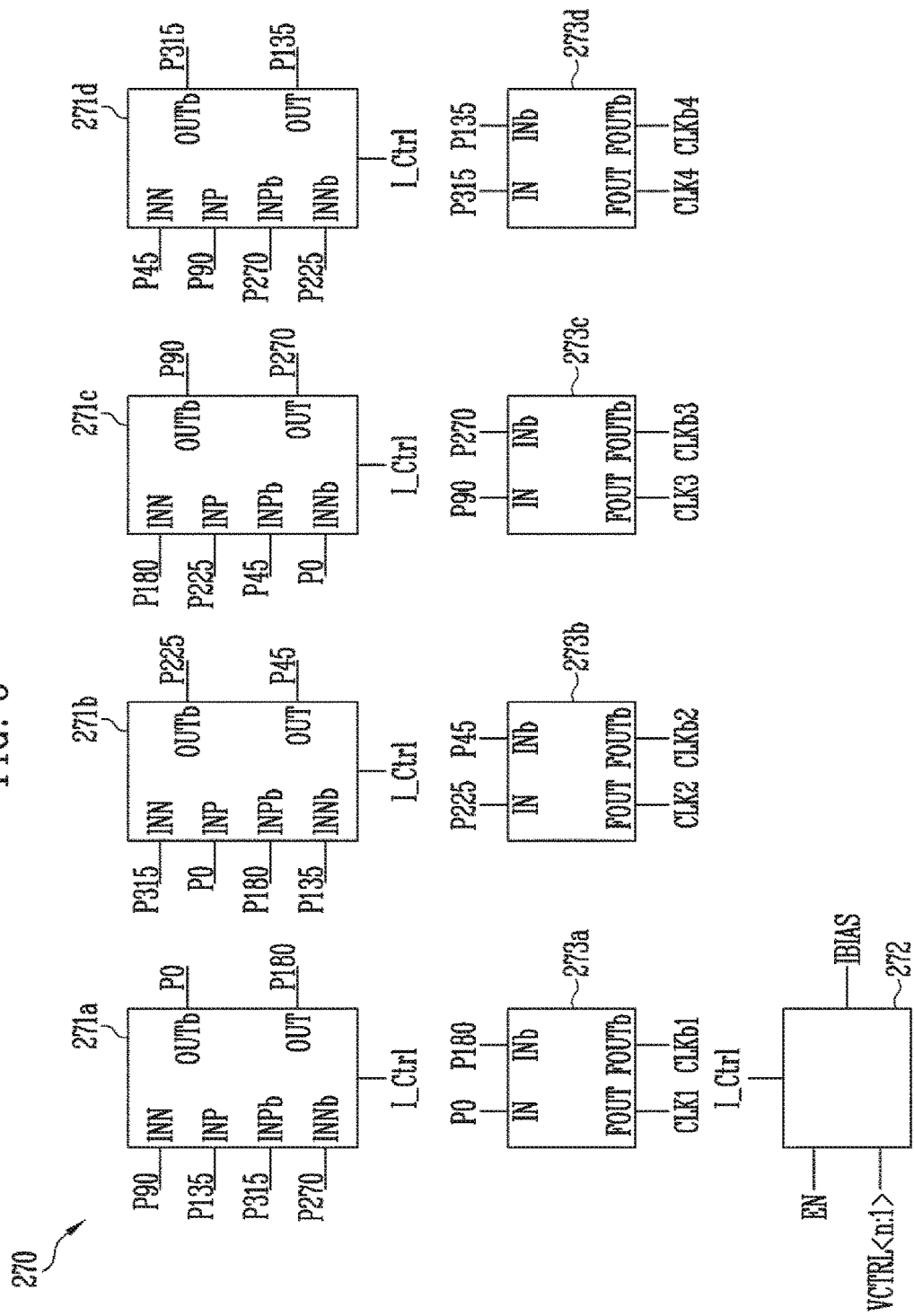
FIG. 8 is a diagram illustrating a ring oscillator according to an embodiment of the present disclosure.

FIG. 8 is a diagram illustrating a ring oscillator 270 according to an embodiment of the present disclosure.

Referring to FIG. 8, the ring oscillator 270 may include four current-controlled delay circuits 271a, 271b, 271c, and 271d, a current control circuit 272, and four differential input-single output converters 273a, 273b, 273c, and 273d.

When the ring oscillator 270 is activated, the enable signal EN may first be logic 'High.' As a result, the current control circuit 272 may be activated. When the current control circuit 272 is activated, the constant current Iconst may flow from the current control node I_Ctrl through the third NMOS transistor MN3 and the fourth NMOS transistor MN4 of FIG. 6. In addition, the current control circuit 272 may change the magnitude of current flowing through the current control node I_Ctrl by the first to n-th control signals VCTRL<n:1>. The period of output clock signals CLK1, CLK2, CLK3, and CLK4 of the ring oscillator 270 may be changed depending on the magnitude of sink current flowing through the current control circuit 272. The current control node I_Ctrl of the current control circuit 272 may be commonly coupled to the current-controlled delay circuits 271a, 271b, 271c, and 271d.

The ring oscillator 270 may include first to fourth current-controlled delay circuits 271a, 271b, 271c, and 271d. Each of the first to fourth current-controlled delay circuits 271a, 271b, 271c, and 271d may have four inputs having different phases, i.e., an N-input INN, a P-input INP, an N-input bar INNb, and a P-input bar INPb. As described with reference to FIG. 5, the phases of the N-input INN, the P-input INP, the N-input bar INNb, and the P-input bar INPb may be different from one another. Each of the first to fourth current-controlled delay circuits 271a, 271b, 271c, and 271d may have two outputs, i.e., an output node OUT and an output bar node OUTb. The output node OUT and the output bar node OUTb may have phases opposite to each other. That is, the output node OUT and the output bar node OUTb may have a phase difference of 180 degrees, for instance.

The first current-controlled delay circuit 271a may output a phase 180 signal P180 through the output node OUT, and output a phase 0 signal P0 through the output bar node OUTb. At this time, the phase 0 signal P0 and the phase 180 signal P180 may have a phase difference of 180 degrees. The phase 0 signal P0 and the phase 180 signal P180, which are output from the first current-controlled delay circuit 271a, may be input to the P-input INP and the P-input bar INPb of the second current-controlled delay circuit 271b, respectively. In other words, the two output nodes, i.e., the output bar node OUTb and the output node OUT of the first current-controlled delay circuit 271a may be coupled to the two input nodes, i.e., the P-input INP and the P-input bar INPb of the second current-controlled circuit 271b, respectively. In addition, the phase 0 signal P0 and the phase 180 signal P180, which are output through the first current-controlled delay circuit 271a, may be input to the N-input bar INNb and the N-input INN of the third current-controlled delay circuit 271c, respectively. In other words, the two output nodes, i.e., the output bar node OUTb and the output node OUT of the first current-controlled delay circuit 271a may be coupled to the two input nodes, i.e., the N-input bar INNb and the N-input INN of the third current-controlled delay circuit 271c, respectively.

The second current-controlled delay circuit 271b may output a phase 225 signal P225 through the output bar node OUTb, and output a phase 45 signal P45 through the output node OUT. At this time, the phase 45 signal P45 and the phase 225 signal P225 may have a phase difference of 180 degrees, for instance. In addition, when the phase 0 signal P0 has a phase of 0 degree, the phase 45 signal P45 may have a phase of 45 degrees, and the phase 225 signal P225 may have a phase of 225 degrees, for instance. The phase 45 signal P45 and the phase 225 signal P225, which are output from the second current-controlled delay circuit 271b, may be input to the P-input bar INPb and the P-input INP of the third current-controlled delay circuit 271c, respectively. In other words, the two output nodes, i.e., the output bar node OUTb and the output node OUT of the second current-controlled delay circuit 271b may be coupled to the two input nodes, i.e., the P-input INP and the P-input bar INPb of the third current-controlled delay circuit 271c, respectively. In addition, the phase 225 signal P225 and the phase 45 signal P45, which are output through the second current-controlled delay circuit 271b, may be input to the N-input bar INNb and the N-input INN of the fourth current-controlled delay circuit 271d, respectively. In other words, the two output nodes, the output bar node OUTb and the output node OUT of the second current-controlled delay circuit 271b may be coupled to the two input nodes, the N-input bar INNb and the N-input INN of the fourth current-controlled delay circuit 271d, respectively.

A phase 90 signal P90 and a phase 270 signal P270, which are output through the third current-controlled delay circuit 271c, may be input to the P-input INP and the P-input bar INPb of the fourth current-controlled delay circuit 271d, respectively. In other words, the two output nodes, the output bar node OUTb and the output node OUT of the third current-controlled delay circuit 271c may be coupled to the two input nodes, i.e., the P-input bar INPb and the P-input INP of the fourth current-controlled delay circuit 271d, respectively. In addition, the phase 90 signal P90 and the phase 270 signal P270, which are output from the third current-controlled delay circuit 271c, may be input to the N-input INN and the N-input bar INNb of the first current-controlled delay circuit 271c, respectively. In other words, the two output nodes, the output bar node OUTb and the output node OUT of the third current-controlled delay circuit 271c may be coupled to the two input nodes, i.e., the N-input INN and the N-input bar INNb of the first current-controlled delay circuit 271a, respectively.

A phase 315 signal P315 and a phase 135 signal P135, which are output through the fourth current-controlled delay circuit 271d may be input to the P-input bar INPb and the P-input INP of the first current-controlled delay circuit 271a. In other words, the two output nodes, i.e., the output bar node OUTb and the output node OUT of the fourth current-controlled delay circuit 271d may be coupled to the two input nodes, i.e., the P-input bar INPb and the P-input INP of the first current-controlled delay circuit 271a, respectively. In addition, the phase 315 signal P315 and the phase 135 signal P135, which are output from the fourth current-controlled delay circuit 271d, may be input to the N-input INN and the N-input bar INNb of the second current-controlled delay circuit 271b. In other words, the two output nodes, i.e., the output bar node OUTb and the output node OUT of the fourth current-controlled delay circuit 271d may be coupled to the two input nodes, i.e., the N-input INN and the N-input bar INNb of the second current-controlled delay circuit 271b.

At this time, unlike the first to third current-controlled delay circuits 271a, 271b, and 271c, the phase 315 signal P315 and the phase 135 signal P135, which are output through the fourth current-controlled delay circuit 271d, may be input to the P-input bar INPb and the P-input INP of the first current-controlled delay circuit 271a, respectively, and be input to the N-input INN and the N-input bar INNb of the second current-controlled delay circuit 271b, respectively. That is, the relationship between the input and output nodes in the fourth current-controlled delay circuit 271d is reversed once, making an oscillation operation of the ring oscillator 270 is possible.

As an example, when the phase 0 signal P0 has a phase of 0 degree, the phase 45 signal P45, the phase 90 signal P90, the phase 135 signal P135, the phase 180 signal P180, the phase 225 signal P225, the phase 270 signal P270, and the phase 315 signal P315 may, sequentially or in the stated order, have phases of 45 degrees, 90 degrees, 135 degrees, 180 degrees, 225 degrees, and 270 degrees, respectively. When the ring oscillator 270 is designed and arranged, the above-described signals may accurately have a phase difference of 45 degrees as described above in accordance with one embodiment. To this end, the arrangement of the four current-controlled delay circuits 271a, 271b, 271c, and 271d and the matching, i.e., symmetry of lines for signal transmission, may be important.

The phase 180 signal P180 and the phase 0 signal P0, which are output through the first current-controlled delay circuit 271a, may be input to two input nodes of a first differential input-single output converter 273a, i.e., the input node IN and the input bar node INb of FIG. 7, respectively. The first differential input-single output converter 273a may output a first clock signal CLK1 and a first clock bar signal CLKb1 in response to the phase 180 signal P180 and the phase 0 signal P0.

The phase 225 signal P225 and the phase 45 signal P45, which are output through the second current-controlled delay circuit 271b, may be input to two input nodes of a second differential input-single output converter 273b, i.e., the input node IN and the input bar node INb of FIG. 7, respectively. The second differential input-single output converter 273b may output a second clock signal CLK2 and a second clock bar signal CLKb2 in response to the phase 225 signal P225 and the phase 45 signal P45.

The phase 90 signal P90 and the phase 270 signal P270, which are output through the third current-controlled delay circuit 271c, may be input to two input nodes of a third differential input-single output converter 273c, i.e., the input node IN and the input bar node INb of FIG. 7, respectively. The third differential input-single output converter 273c may output a third clock signal CLK3 and a third clock bar signal CLKb3 in response to the phase 90 signal P90 and the phase 270 signal P270.

The phase 315 signal P315 and the phase 135 signal P135, which are output through the fourth current-controlled delay circuit 271d, may be input to two input nodes of a fourth differential input-single output converter 273d, i.e., the input node IN and the input bar node INb of FIG. 7, respectively. The fourth differential input-single output converter 273d may output a fourth clock signal CLK4 and a fourth clock bar signal CLKb4 in response to the phase 315 signal P315 and the phase 135 signal P135.

In accordance with one embodiment, any one of the first to fourth clock signals CLK1 to CLK4 and the first to fourth clock bar signals CLKb1 to CLKb4, which are output by the ring oscillator 270, may be transferred to the control logic 300, the column decoder 240, or the input/output circuit 250. In other words, the control logic 300, the column decoder 240, or the input/output circuit 250 may use only any one of the first to fourth clock signals CLK1 to CLK4 and the first to fourth clock bar signals CLKb1 to CLKb4. Nevertheless, the ring oscillator 270 may include all of the first to fourth differential input-single output converters 273a, 273b, 273c, and 273d so as to match output loads of the first to fourth current-controlled delay circuits 271a, 271b, 271c, and 271d. In other words, the ring oscillator 270 may match the output load of each of the first to fourth current-controlled delay circuits 271a, 271b, 271c, and 271d so as to accurately match phase differences between the phase 0 signal P0, the phase 45 signal P45, the phase 90 signal P90, the phase 135 signal P135, the phase 180 signal P180, the phase 225 signal P225, the phase 270 signal P270, and the phase 315 signal P315. To this end, the ring oscillator 270 may include all of the first to fourth to differential input-single output converters 273a, 273b, 273c, and 273d. As another example, two or more or all of the first to fourth clock signals CLK1 to CLK4 and the first to fourth clock bar signals CLKb1 to CLKb4, which are output by the ring oscillator 270, may be transferred to the control logic 300, the column decoder 240, or the input/output circuit 250. In other words, the control logic 300, the column decoder 240, or the input/output circuit 250 may use two or more or all of the first to fourth clock signals CLK1 to CLK4 and the first to fourth clock bar signals CLKb1 to CLKb4.

Figure 9:
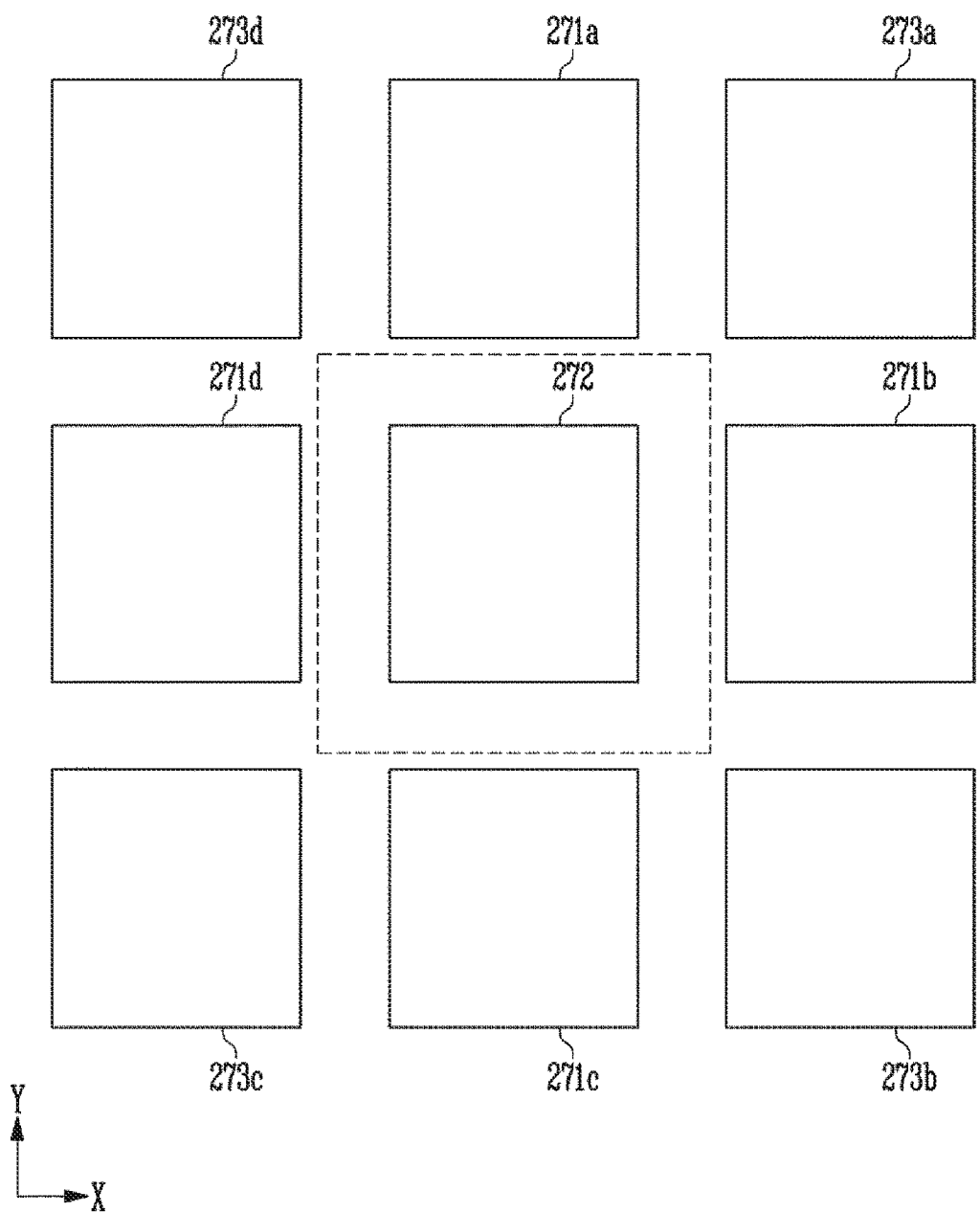
FIG. 9 is a diagram illustrating an arrangement of the ring oscillator according to an embodiment of the present disclosure.

FIG. 9 is a diagram illustrating an arrangement of the ring oscillator 270 according to an embodiment of the present disclosure.

Referring to FIG. 9, the four current-controlled delay circuits 271a, 271b, 271c, and 271d of the ring oscillator 270 may be arranged adjacent or at four sides of a square (see a dotted line of FIG. 9), respectively. The square is conceptually illustrated to describe the arrangement of the four current-controlled delay circuits 271a, 271b, 271c, and 271d, and is not actually implemented. In other words, the four current-controlled delay circuits 271a, 271b, 271c, and 271d of the ring oscillator 270 may be arranged symmetrically to each other about a virtual square. As an example, the four current-controlled delay circuits 271a, 271b, 271c, and 271d may be arranged symmetrically to each other about the x and y axes. As another example, the four current-controlled delay circuits 271a, 271b, 271c, and 271d of the ring oscillator 270 may be arranged adjacent or at the four sides of the square (see the to dotted line of FIG. 9), respectively. In other words, if the centers of the four current-controlled delay circuits 271a, 271b, 271c, and 271d of the ring oscillator 270 are connected, the shape of a square may be formed.

The four differential input-single output converters 273a, 273b, 273c, and 273d of the ring oscillator 270 may be located adjacent or at the four vertexes of the square, respectively. In other words, the first differential input-single output converter 273a may be located adjacent or at one vertex of one side of the square, adjacent or at which the first current-controlled delay circuit 271a is located. In addition, the second differential input-single output converter 273b may be located adjacent or at one vertex of another side of the square, adjacent or at which the second current-controlled delay circuit 271b is located. The third differential input-single output converter 273c may be located adjacent or at one vertex of still another side of the square, adjacent or at which the third current-controlled delay circuit 271c is located. In addition, the fourth differential input-single output converter 273d may be located adjacent or at one vertex of still another side of the square, adjacent or at which the fourth current-controlled delay circuit 271d is located. In other words, the first current-controlled delay circuit 271a, the first differential input-single output converter 273a, the second current-controlled delay circuit 271b, the second differential input-single output converter 273b, the third current-controlled delay circuit 271c, the third differential input-single output converter 273c, the fourth current-controlled delay circuit 271d, and the fourth differential input-single output converter 273d may be, sequentially or in the stated order, arranged clockwise adjacent or at the four sides and the four vertexes of the square.

By the above-described arrangement, a first routing load generated by a line connection between the first current-controlled delay circuit 271a and the first differential input-single output converter 273a, a second routing load generated by a line connection between the second current-controlled delay circuit 271b and the second differential input-single output converter 273b, a third routing load generated by a line connection between the third current-controlled delay circuit 271c and the third differential input-single output converter 273c, and a fourth routing load generated by a line connection between the fourth current-controlled delay circuit 271d and the fourth differential input-single output converter 273d may be equal to one another. The routing load refers to resistance-capacitance RC generated in a line for signal transfer, and a time delay may occur when a signal generated by the resistance capacitance RC is transferred. That is, the fact that routing loads of two lines are equal to each other may mean that time delays are equal to each other when a signal is transferred through the two lines. Alternatively, the fact that routing loads of two lines are equal to each other may mean that physical lengths of the two lines and physical widths of the two lines are equal to each other.

By the above-described arrangement, a routing load between the phase 0 signal P0 and the phase 180 signal P180 of FIG. 8, which are output from the first current-controlled circuit 271a and are input to the second- and third-controlled delay circuits 271b and 271c, a routing load between the phase 225 signal P225 and the phase 45 signal P45 of FIG. 8, which are output from the second current-controlled circuit 271b and are input to the third- and fourth-controlled delay circuits 271c and 271d, a routing load between the phase 90 signal P90 and the phase 270 signal P270 of FIG. 8, which are output from the third current-controlled delay circuit 271c and are input to the fourth- and first-controlled delay circuits 271d and 271a, and a routing load between the phase 315 signal P315 and the phase 135 signal P135 of FIG. 8, which are output from the fourth current-controlled delay circuit 271d and are input to the first- and second-controlled delay circuits 271a and 271b may be equal to one another.

By the above-described arrangement, the phase 0 signal P0, the phase 45 signal P45, the phase 90 signal P90, the phase 135 signal P135, the phase 180 signal P180, the phase 225 signal P225, the phase 270 signal P270, and the phase 315 signal P315 may accurately have a phase different of 45 degrees. Accordingly, duty ratios of the first to fourth clock signals CLK1 to CLK4 output from the ring oscillator 270 can be accurately adjusted. The duty ratio of a signal refers to a ratio of the size of a time section in which the signal is logic 'High' to the size of a time section in which the signal is logic 'Low.' The fact the duty ratio is adjusted means that the size of the time section in which the signal is logic 'High' to the size of the time section in which the signal is logic 'Low' are adjusted equal to each other.

The current control circuit 272 may be arranged adjacent or at the center of the square. Accordingly, routing loads generated by line connections between the first to fourth current-controlled delay circuits 271a, 271b, 271c, and 271d and the current control circuit 272 may be equal to one another.

Figure 10:
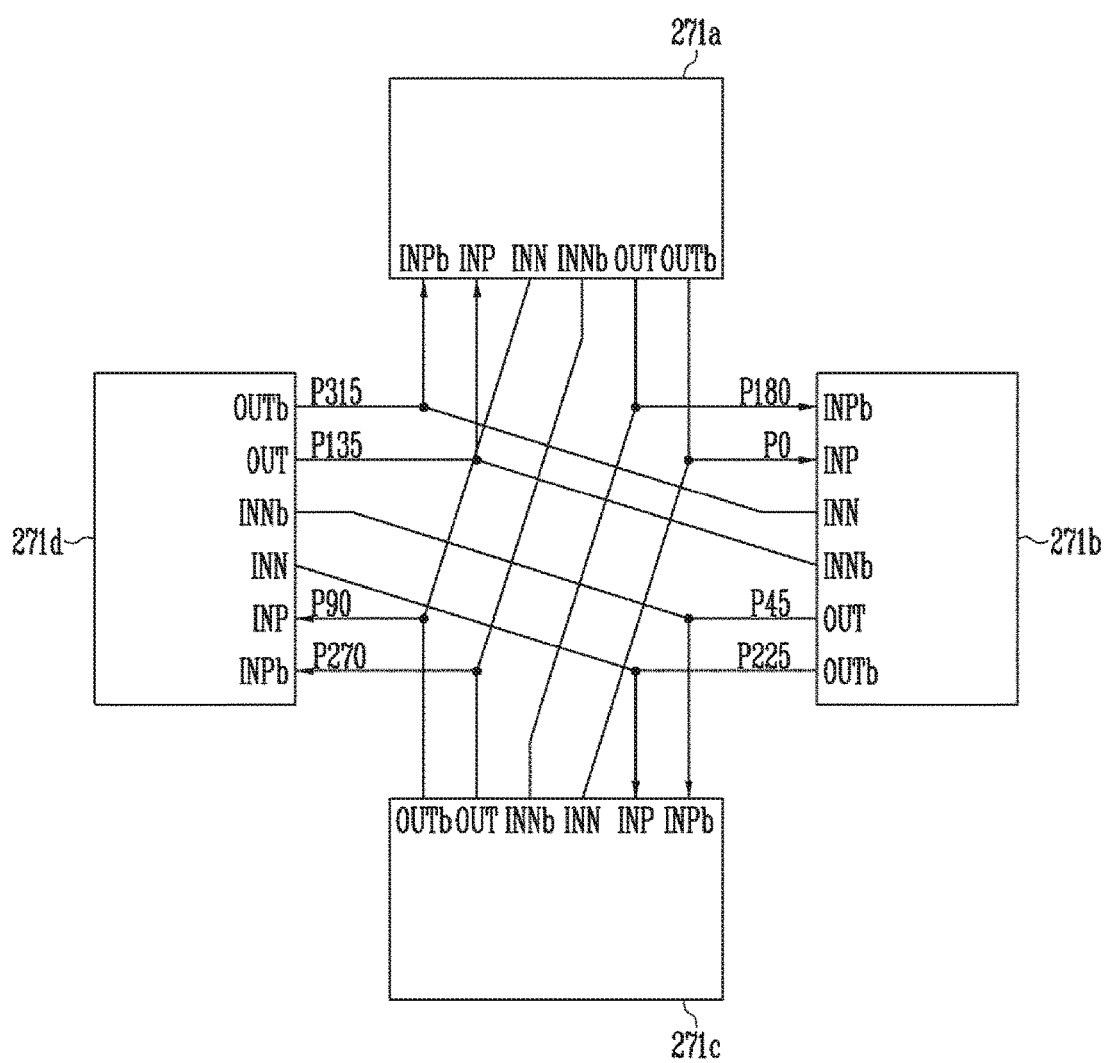
FIG. 10 is a diagram illustrating wiring of the ring oscillator according to an embodiment of the present disclosure.

FIG. 10 is a diagram illustrating wiring of the ring oscillator 270 according to an embodiment of the present disclosure.

Referring to FIG. 10, input/output nodes of the four current-controlled delay circuits 271a, 271b, 271c, and 271d of the ring oscillator 270, i.e., lines for transmitting the phase 0 signal P0, the phase 45 signal P45, the phase 90 signal P90, the phase 135 signal P135, the phase 180 signal P180, the phase 225 signal P225, the phase 270 signal P270, and the phase 315 signal P315 have symmetry. By this symmetry, time delays occurring in the lines when the signals are transferred may be equal to one another. In other words, the lines for transmitting the phase 0 signal P0, the phase 45 signal P45, the phase 90 signal P90, the phase 135 signal P135, the phase 180 signal P180, the phase 225 signal P225, the phase 270 signal P270, and the phase 315 signal P315 may be arranged to have the same routing load.

Electrical routing loads generated by lines corresponding to transmission paths of the phase 0 signal P0 and the phase 180 signal P180, which are output from the first current-controlled delay circuit 271*a* and then input to the second current-controlled delay circuit 271*b* and the third current-controlled delay circuit 271*c*, transmission paths of the phase 45 signal P45 and the phase 225 signal P225, which are output from the second current-controlled delay circuit 271*b* and then input to the third current-controlled delay circuit 271*c* and the fourth current-controlled delay circuit 271*d*, transmission paths of the phase 90 signal P90 and the phase 270 signal P270, which are input from the third current-controlled delay circuit 271*c* and then input to the fourth current-controlled delay circuit 271*d* and the first current-controlled delay circuit 271*a*, and transmission paths of the phase 135 signal P135 and the phase 315 signal P315, which are output from the fourth current-controlled delay circuit 271*d* and then input to the first current-controlled delay circuit 271*a* and the second current-controlled delay circuit 271*b*, may be equal to each other, respectively. By the matching of the above-described signal transmission paths, phase differences between the phase 0 signal P0, the phase 45 signal P45, the phase 90 signal P90, the phase 135 signal P135, the phase 180 signal P180, the phase 225 signal P225, the phase 270 signal P270, and the phase 315 signal P315 may be generated by 45 degrees. Accordingly, the duty ratios of the first to fourth clock signals CLK1 to CLK4 output from the ring oscillator 270 can be accurately matched.

The arrangement of the lines of FIG. 10 is merely one example, and the matching of signal delays caused by the lines for transmitting the phase 0 signal P0, the phase 45 signal P45, the phase 90 signal P90, the phase 135 signal P135, the phase 180 signal P180, the phase 225 signal P225, the phase 270 signal P270, and the phase 315 signal P315, i.e., the arrangement of lines of which signal delays may be the same belongs to the scope of the present disclosure. In other words, as the first to fourth current-controlled delay circuits 271*a*, 271*b*, 271*c*, and 271*d* are arranged adjacent or at the four sides of the square, the lines for transmitting signals between the first to fourth current-controlled delay circuits 271*a*, 271*b*, 271*c*, and 271*d* are arranged symmetrically to each other. Accordingly, the phase differences between the phase 0 signal P0, the phase 45 signal P45, the phase 90 signal P90, the phase 135 signal P135, the phase 180 signal P180, the phase 225 signal P225, the phase 270 signal P270, and the phase 315 signal P315 can be generated by 45 degrees. Consequently, the duty ratios of the first to fourth clock signals CLK1 to CLK4 output from the ring oscillator 270 can be accurately matched.

Figure 11:
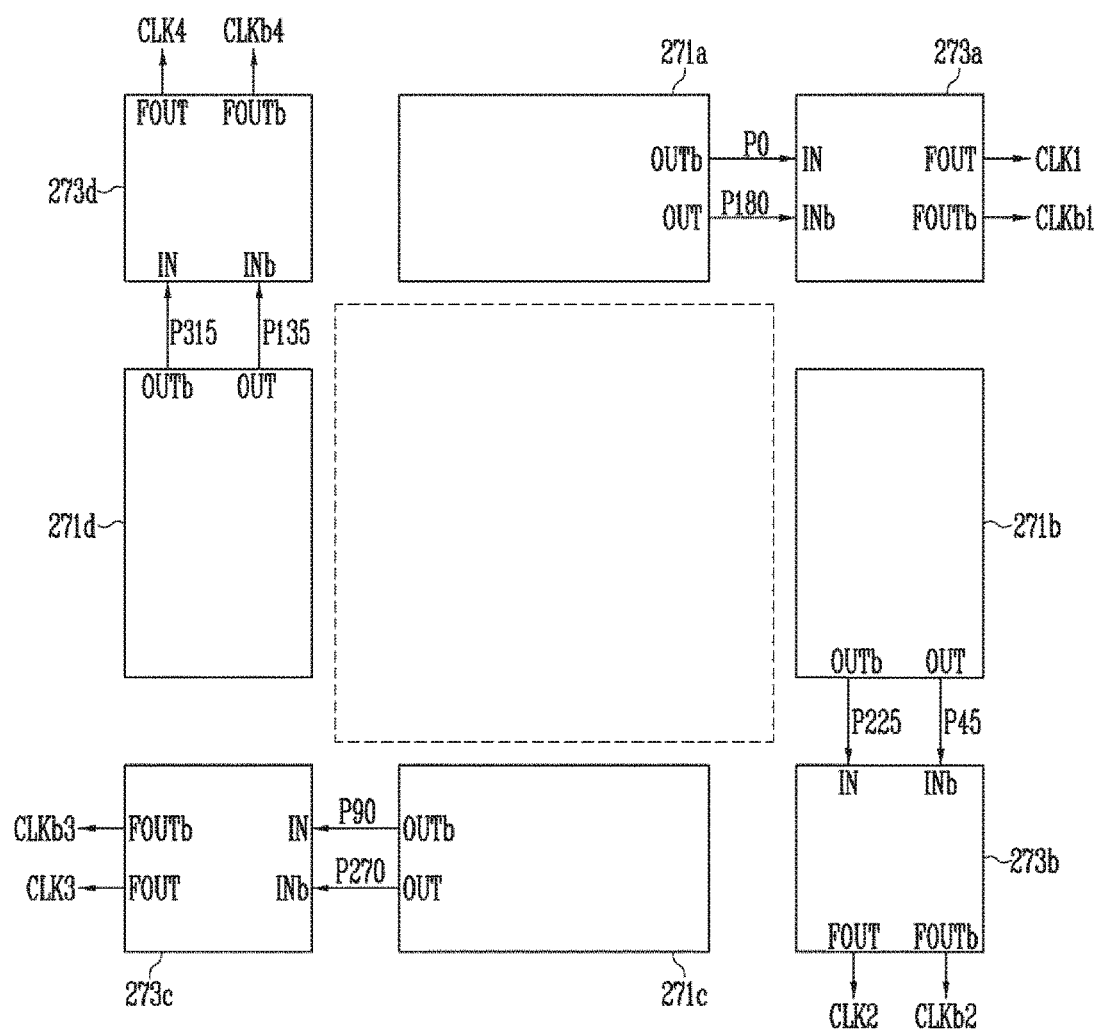
FIG. 11 is a diagram illustrating wiring of the ring oscillator according to an embodiment of the present disclosure.

FIG. 11 is a diagram illustrating wiring of the ring oscillator 270 according to an embodiment of the present disclosure.

Referring to FIG. 11, the four current-controlled delay circuits 271*a*, 271*b*, 271*c*, and 271*d* of the ring oscillator 270 may be arranged adjacent or at four sides of a square (see a dotted line of FIG. 11), respectively, and the four differential input-single output converters 273*a*, 273*b*, 273*c*, and 273*d* may be located adjacent or at four vertexes of the square, respectively.

By the above-described arrangement, electrical routing loads generated by lines corresponding to paths of the phase 0 signal P0 and the phase 180 signal P180, which are output from the first current-controlled delay circuit 271*a* and then input the first differential input-single output converter 273*a*, paths of the phase 45 signal P45 and the phase 225 signal P225, which are output from the second current-controlled delay circuit 271*b* and then input to the second differential input-single output converter 273*b*, paths of the phase 90 signal P90 and the phase 270 signal P270, which are output from the third current-controlled delay circuit 271*c* and then input to the third differential input-single output converter 273*c*, and paths of the phase 315 signal P315 and the phase 135 signal P135, which are output from the fourth current-controlled delay circuit 271*d* and then input to the fourth differential input-single output converter 273*d*, may be matched equal to each other, respectively. In other words, electrical signal transfer time delays occurring in the lines for transferring the phase 0 signal P0, the phase 45 signal P45, the phase 90 signal P90, the phase 135 signal P135, the phase 180 signal P180, the phase 225 signal P225, the phase 270 signal P270, and the phase 315 signal P315 may be matched equal to each other. By the above-described matching of signal transmission paths, phase differences between the phase 0 signal P0, the phase 45 signal P45, the phase 90 signal P90, the phase 135 signal P135, the phase 180 signal P180, the phase 225 signal P225, the phase 270 signal P270, and the phase 315 signal P315 may be generated by 45 degrees. Accordingly, the duty ratios of clock signals CLK output from the ring oscillator 270 can be accurately matched. In addition, the first to fourth clock signals CLK1 to to CLK4 and the first to fourth clock bar signals CLKb1 to CLKb4, of which duty ratios are accurately matched, can be generated.

Figure 12:
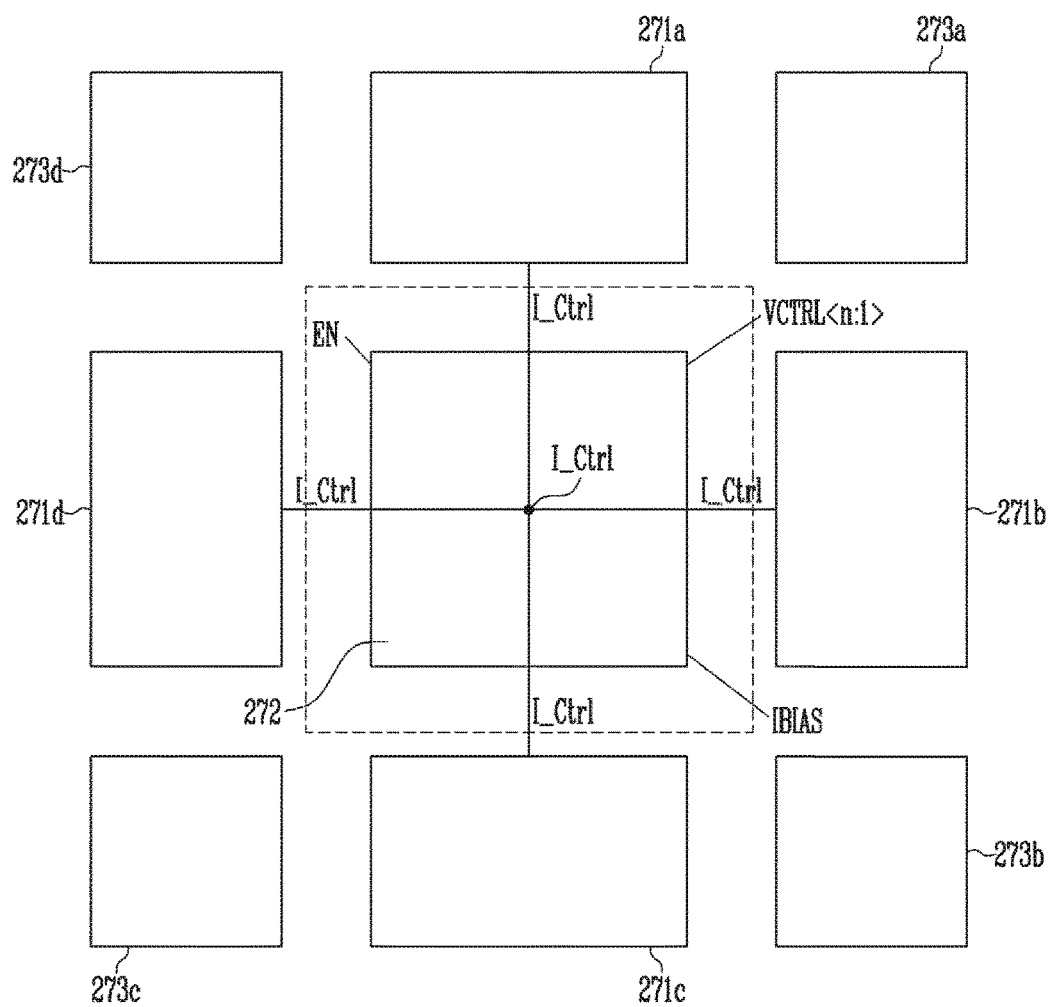
FIG. 12 is a diagram illustrating wiring of the ring oscillator according to an embodiment of the present disclosure.

FIG. 12 is a diagram illustrating wiring of the ring oscillator 270 according to an embodiment of the present disclosure.

Referring to FIG. 12, the current control circuit 272 of the ring oscillator 270 may be arranged adjacent or at the center of a square (see a dotted line of FIG. 12) formed by the four current-controlled delay circuits 271*a*, 271*b*, 271*c*, and 271*d*, and the four differential input-single output converters 273*a*, 273*b*, 273*c*, and 273*d*. By this arrangement, routing loads generated by lines for coupling of current control nodes I_Ctrl between the current control circuit 272 and the four current-controlled delay circuits 271*a*, 271*b*, 271*c*, and 271*d* may be arranged equal to each other. As a result, currents flowing through the respective current control nodes I_Ctrl when the four current-controlled delay circuits 271*a*, 271*b*, 271*c*, and 271*d* are activated may be equal to one another. In other words, by the above-described arrangement, the currents flowing through the respective current control nodes I_Ctrl when the four current-controlled delay circuits 271*a*, 271*b*, 271*c*, and 271*d* are activated are matched equal to one another. As a result, the phase differences between the phase 0 signal P0, the phase 45 signal P45, the phase 90 signal P90, the phase 135 signal P135, the phase 180 signal P180, the phase 225 signal P225, the phase 270 signal P270, and the phase 315 signal P315 may be generated by 45 degrees. Accordingly, the duty ratios of clock signals CLK output from the ring oscillator 270 can be accurately matched.

Figure 13:
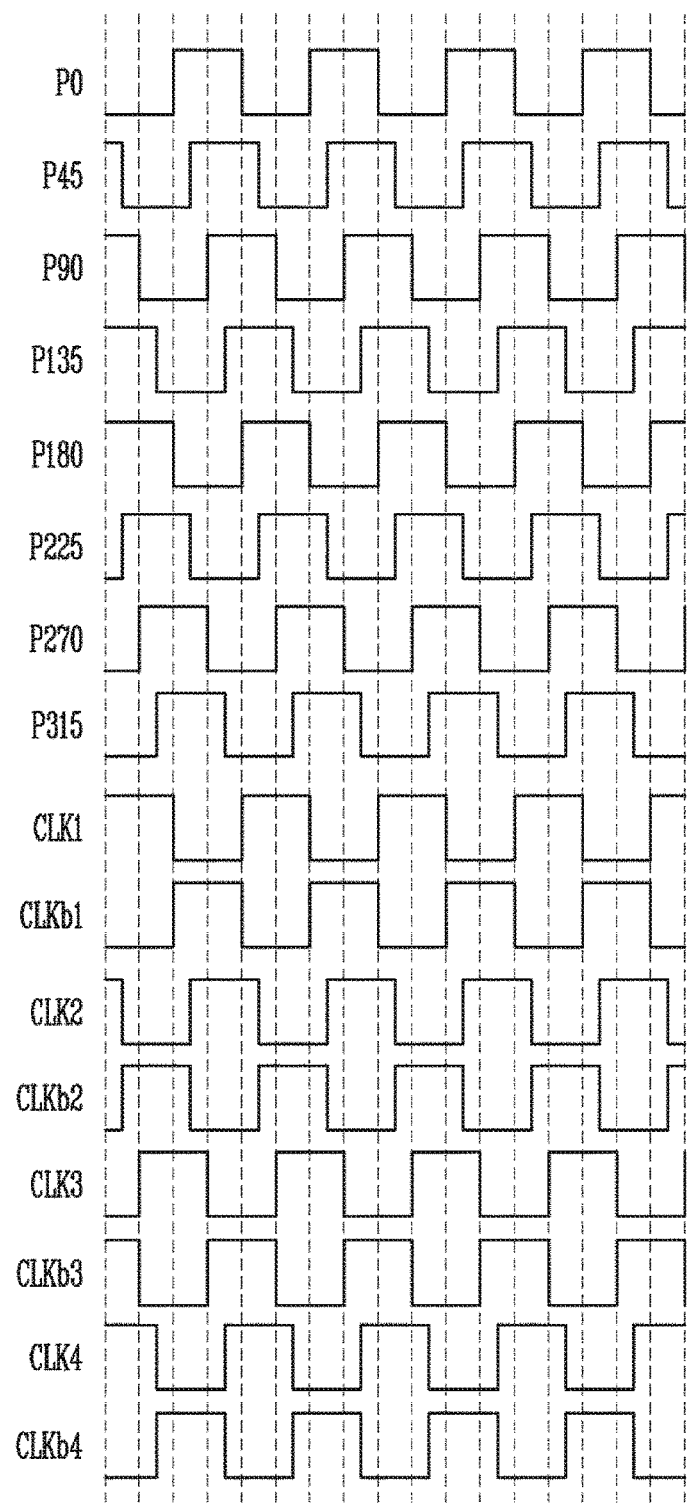
FIG. 13 is a diagram illustrating an operation of the ring oscillator according to an embodiment of the present disclosure.

FIG. 13 is a diagram illustrating an operation of the ring oscillator 270 according to an embodiment of the present disclosure.

Referring to FIG. 13, by the above-described arrangement, the phase differences between the phase 0 signal P0, the phase 45 signal P45, the phase 90 signal P90, the phase 135 signal P135, the phase 180 signal P180, the phase 225 signal P225, the phase 270 signal P270, and the phase 315 signal P315 may be generated by 45 degrees. Accordingly, duty ratios of the first to fourth clock signals CLK1 to CLK4 and the first to fourth clock bar signals CLKb1 to CLKb4 can be accurately matched.

Figure 14:
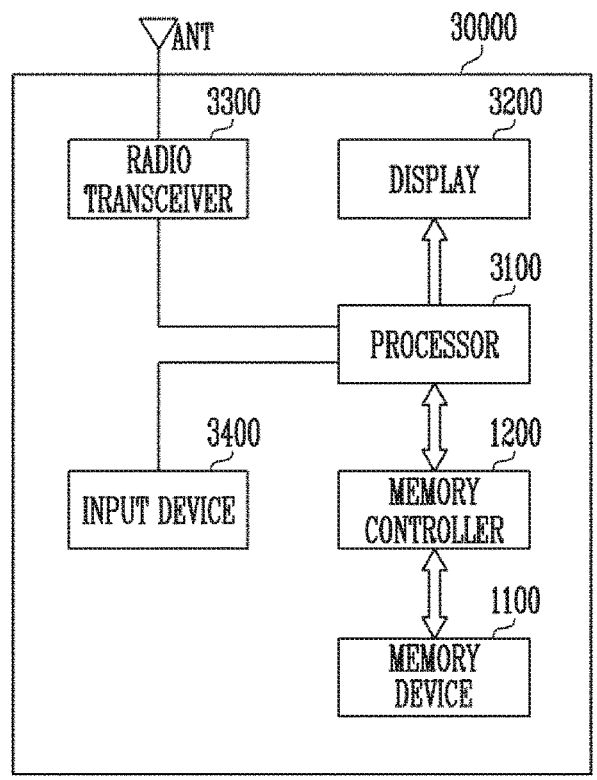
FIG. 14 is a diagram illustrating another embodiment of the memory system including the memory device shown in FIG. 3.

FIG. 14 is a diagram illustrating an embodiment of the memory system including the memory controller shown in FIG. 2 and the memory device shown in FIG. 3.

Referring to FIG. 14, the memory system 30000 may be implemented in electronic devices such as a cellular phone, a smart phone, a tablet PC, a personal digital assistant (PDA), a wireless communication device, and the like. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the semiconductor memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 15:
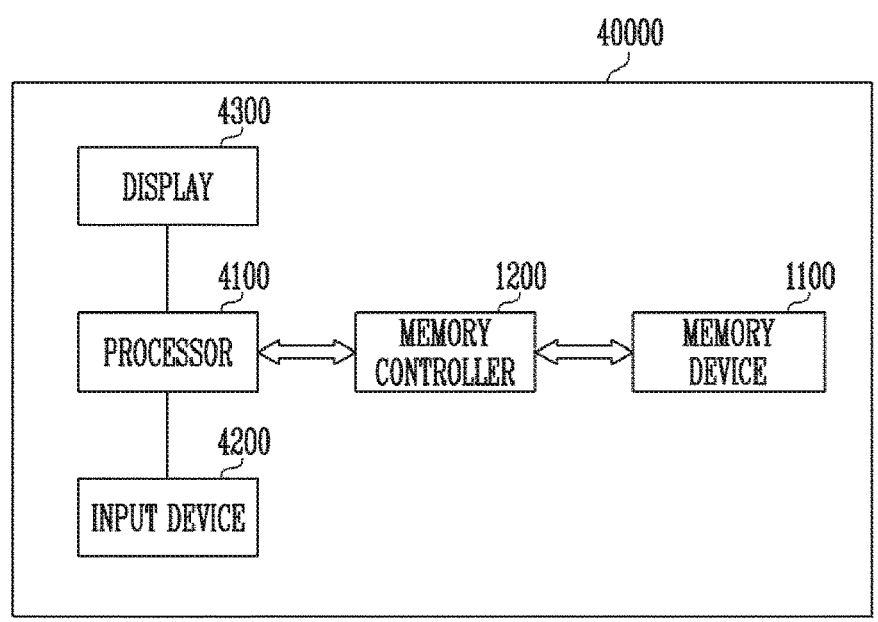
FIG. 15 is a diagram illustrating another embodiment of the memory system including the memory device shown in FIG. 3.

FIG. 15 is a diagram illustrating an embodiment of the memory system including the memory controller shown in FIG. 2 and the memory device shown in FIG. 3.

Referring to FIG. 15, the memory system 40000 may be implemented in electronic devices such as a personal computer (PC), a tablet PC, a net-book, an e-reader, a personal digital assistant (PDA), a portable multimedia player (PMP), an MP3 player, an MP4 player, and the like.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 16:
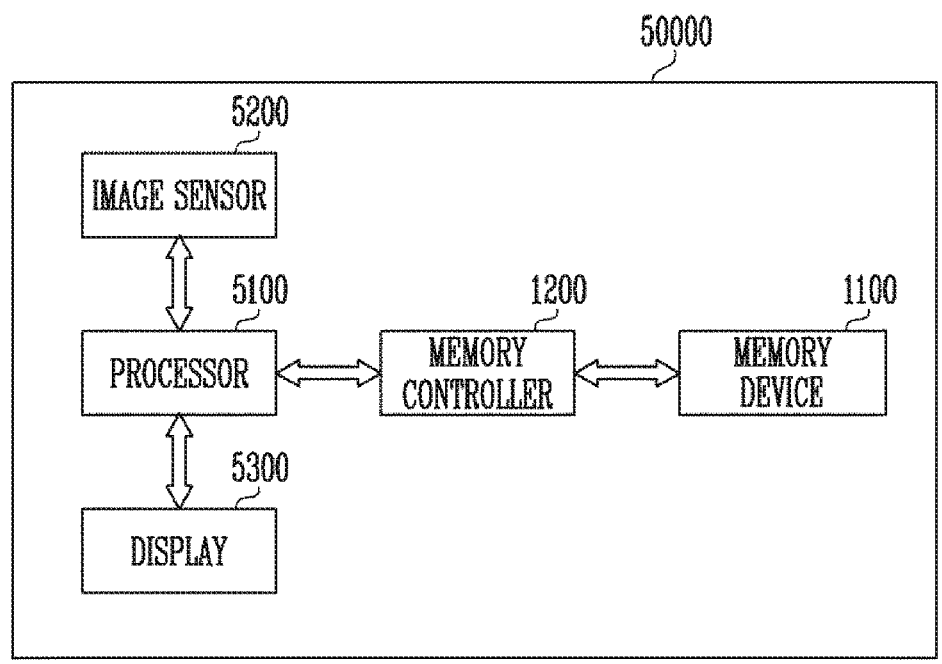
FIG. 16 is a diagram illustrating another embodiment of the memory system including the memory device shown in FIG. 3.

FIG. 16 is a diagram illustrating an embodiment of the memory system including the memory controller shown in FIG. 2 and the memory device shown in FIG. 3.

Referring to FIG. 16, the memory system 50000 may be implemented in electronic devices such as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 17:
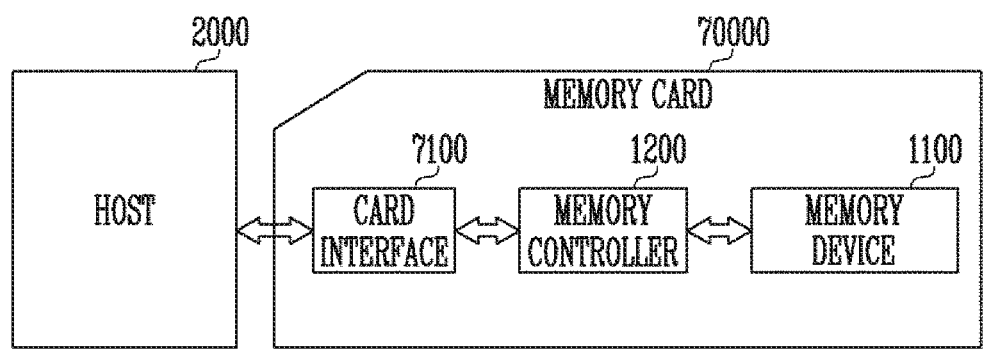
FIG. 17 is a diagram illustrating another embodiment of the memory system including the memory device shown in FIG. 3.

FIG. 17 is a diagram illustrating an embodiment of the memory system including the memory controller shown in FIG. 2 and the memory device shown in FIG. 3.

Referring to FIG. 17, the memory system 70000 may be implemented in electronic devices such as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

According to the present disclosure, the duty ratio of a clock signal generated by the ring oscillator can be accurately matched through the symmetrical arrangement of the ring oscillator.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A ring oscillator comprising:
   first to fourth current-controlled delay circuits configured to allow a delay time to be changed depending on a magnitude of sink current; and
   a current control circuit configured to control the magnitude of the sink current,
   wherein the current control circuit is arranged at a center of a square, and
   wherein the first to fourth current-controlled delay circuits are arranged symmetrically to each other about the square.

2. The ring oscillator of claim 1, wherein the first to fourth current-controlled delay circuits are arranged adjacent or at four sides of the square, respectively,
   each of the first to fourth current-controlled delay circuits outputs a first output signal and a second output signal,
   the first output signal and the second output signal of the first current-controlled delay circuit are transferred to first and second input nodes of the second current-controlled delay circuit and third and fourth input nodes of the third current-controlled delay circuit, and
   the first output signal and the second output signal have a phase difference of 180 degrees.

3. The ring oscillator of claim 2, wherein the first output signal of the fourth current-controlled delay circuit and the first output signal of the first current-controlled delay circuit have a phase difference of 45 degrees.

4. The ring oscillator of claim 2, wherein lines for transferring the first output signals and the second output signals output by the first to fourth current-controlled delay circuits have routing loads equal to one another.

5. The ring oscillator of claim 1, wherein a period of a clock signal output from the ring oscillator is shortened as the sink current increases.

6. The ring oscillator of claim 1, further comprising first to fourth differential input single output converters respectively coupled to the first to fourth current-controlled delay circuits,
   wherein the first to fourth differential input single output converters are arranged adjacent or at four vertexes of the square, respectively.

7. The ring oscillator of claim 6, wherein the first differential input single output converter is arranged adjacent or at one vertex of a first side of the square, adjacent or at which the first current-controlled delay circuit is arranged.

8. The ring oscillator of claim 7, wherein each of the first to fourth differential input single output converters receives a first input signal and a second input signal, which are transferred from each of the first to fourth current-controlled delay circuit, and
   lines for transferring the first input signal and the second input signal, which are input from each of the first to fourth differential input single output converters, have routing loads equal to one another.

9. The ring oscillator of claim 7, wherein the current control circuit is commonly coupled to the first to fourth current-controlled delay circuits.

10. The ring oscillator of claim 7, wherein each of the first to fourth differential input single output converters includes a pre-amplifier and an output-amplifier,
    wherein two output nodes of the pre-amplifier are coupled to two input nodes of the output-amplifier.

11. The ring oscillator of claim 1, wherein each of the first to fourth current-controlled delay circuits includes first and second PMOS transistors commonly coupled to a power voltage and first and second NMOS transistors commonly coupled to a current control node,
    wherein the first PMOS transistor and the second PMOS transistor are cross-coupled to each other.

12. A semiconductor device comprising:
    a ring oscillator configured to generate a clock signal,
    wherein the ring oscillator includes:
    first to fourth current-controlled delay circuits configured to allow a delay time to be changed depending on a magnitude of sink current;
    a current control circuit configured to determine the magnitude of the sink current and arranged at a center of a square; and
    first to fourth differential input single output converters respectively coupled to the first to fourth current-controlled delay circuits,
    wherein the first to fourth differential input single output converters are arranged adjacent or at four sides of the square, respectively.

13. The semiconductor device of claim 12, wherein the first to fourth differential input single output converters are arranged adjacent or at four vertexes of the square, respectively.

14. The semiconductor device of claim 12, wherein a period of the clock signal is determined by the delay time.

15. The semiconductor device of claim 12, wherein the first to fourth current-controlled delay circuits generate first to eighth signals having different phases, and
    phase differences between the first to eighth signals are generated by 45 degrees.

16. The semiconductor device of claim 12, wherein lines for transferring output signals of the first to fourth current-controlled delay circuits have routing loads equal to one another.

17. A memory device comprising:
    a ring oscillator configured to generate a first clock signal;
    a frequency divider configured to output a second clock signal in response to the first clock signal; and
    an input/output circuit configured to perform a data input/output operation in synchronization with the second clock signal,
    wherein the ring oscillator includes:
    first to fourth current-controlled delay circuits;
    first to fourth differential input single output converters respectively coupled to the first to fourth current-controlled delay circuits; and
    a current control circuit coupled to each of the first to fourth current-controlled delay circuits wherein the current control circuit is arranged adjacent or at a center of a square, wherein the first to fourth current-controlled delay circuits are arranged adjacent or at four sides of the square, respectively, and wherein the first to fourth differential input single output converters are arranged adjacent or at four vertexes of the square, respectively.

18. The memory device of claim 17, wherein the first clock signal has a period that is two times larger than that of the second clock signal.

* * * * *